(12) United States Patent
Schmid et al.

(10) Patent No.: US 8,526,480 B2
(45) Date of Patent: Sep. 3, 2013

(54) SEMICONDUCTOR LASER DEVICE

(75) Inventors: Wolfgang Schmid, Deuerling/Hillohe (DE); Martin Müller, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 498 days.

(21) Appl. No.: 12/224,572

(22) PCT Filed: Feb. 8, 2007

(86) PCT No.: PCT/DE2007/000244
§ 371 (c)(1),
(2), (4) Date: May 12, 2009

(87) PCT Pub. No.: WO2007/098730
PCT Pub. Date: Sep. 7, 2007

(65) Prior Publication Data
US 2009/0304038 A1    Dec. 10, 2009

(30) Foreign Application Priority Data

Feb. 28, 2006  (DE) .................... 10 2006 009 237
Mar. 10, 2006  (DE) .................... 10 2006 011 284

(51) Int. Cl.
*H01S 3/091*    (2006.01)

(52) U.S. Cl.
USPC ................. 372/75; 372/50.124; 372/70

(58) Field of Classification Search
USPC .................. 372/50.124, 70, 75
See application file for complete search history.

(56) References Cited

U.S. PATENT DOCUMENTS

| | | | |
|---|---|---|---|
| 4,845,724 A | 7/1989 | Hayakawa et al. | |
| 5,748,653 A | 5/1998 | Parker et al. | |
| 6,424,669 B1 | 7/2002 | Jiang et al. | |
| 6,687,280 B1 | 2/2004 | Kajita | |
| 6,940,885 B1* | 9/2005 | Cheng et al. | 372/50.1 |
| 6,947,460 B2* | 9/2005 | Spath et al. | 372/43.01 |
| 6,954,479 B2 | 10/2005 | Albrecht et al. | |
| 7,376,164 B2 | 5/2008 | Takahashi | |
| 7,408,972 B2* | 8/2008 | Schmid et al. | 372/99 |
| 7,529,284 B2* | 5/2009 | Karnutsch et al. | 372/50.124 |
| 2002/0075935 A1 | 6/2002 | Clayton | |
| 2004/0008746 A1* | 1/2004 | Schmidt et al. | 372/46 |

(Continued)

FOREIGN PATENT DOCUMENTS

| DE | 100 26 734 | 12/2001 |
|---|---|---|
| DE | 102 14 120 | 10/2003 |

(Continued)

OTHER PUBLICATIONS

Karnutsch et al. WO 2004/025796.*

*Primary Examiner* — Tod T Van Roy
(74) *Attorney, Agent, or Firm* — Cozen O'Connor

(57) ABSTRACT

A semiconductor laser device comprising an optically pumped surface emitting vertical emitter which emits in a vertical main radiation direction, and at least one monolithically integrated pump radiation source for optically pumping the vertical emitter, wherein the pump radiation source emits pump radiation in a pump main radiation direction extending transversely with respect to the vertical main radiation direction. In accordance with the invention, suitably dimensioned vertical sections are provided such that modes of the pump radiation are forced completely or at least partly in a vertical direction from this section to reduce absorption losses of the pump radiation at conductive layers.

26 Claims, 4 Drawing Sheets

(56) References Cited

U.S. PATENT DOCUMENTS

| | | |
|---|---|---|
| 2004/0022286 A1 | 2/2004 | Spath et al. |
| 2005/0226304 A1 | 10/2005 | Schwarz et al. |
| 2006/0104327 A1 | 5/2006 | Karnutsch et al. |
| 2007/0201531 A1 | 8/2007 | Schmid et al. |
| 2007/0217463 A1 | 9/2007 | Albrecht et al. |

FOREIGN PATENT DOCUMENTS

| | | |
|---|---|---|
| DE | 102 41 192 | 3/2004 |
| DE | 10 2004 011 456 | 8/2005 |
| EP | 1 220 392 | 7/2002 |
| JP | 7-249824 | 9/1995 |
| JP | 2002-270961 | 9/2002 |
| JP | 2003-513477 | 4/2003 |
| JP | 2003-304033 | 10/2003 |
| JP | 2005-303113 | 10/2005 |
| JP | 2005-537674 | 12/2005 |
| JP | 2007-511081 | 4/2007 |
| JP | 2007-511082 | 4/2007 |
| WO | WO 01/33678 | 5/2001 |
| WO | WO 2005/048423 | 5/2005 |
| WO | WO 2005/048424 | 5/2005 |
| WO | WO 2005/101599 | 10/2005 |

* cited by examiner

FIG 2A (A-A)
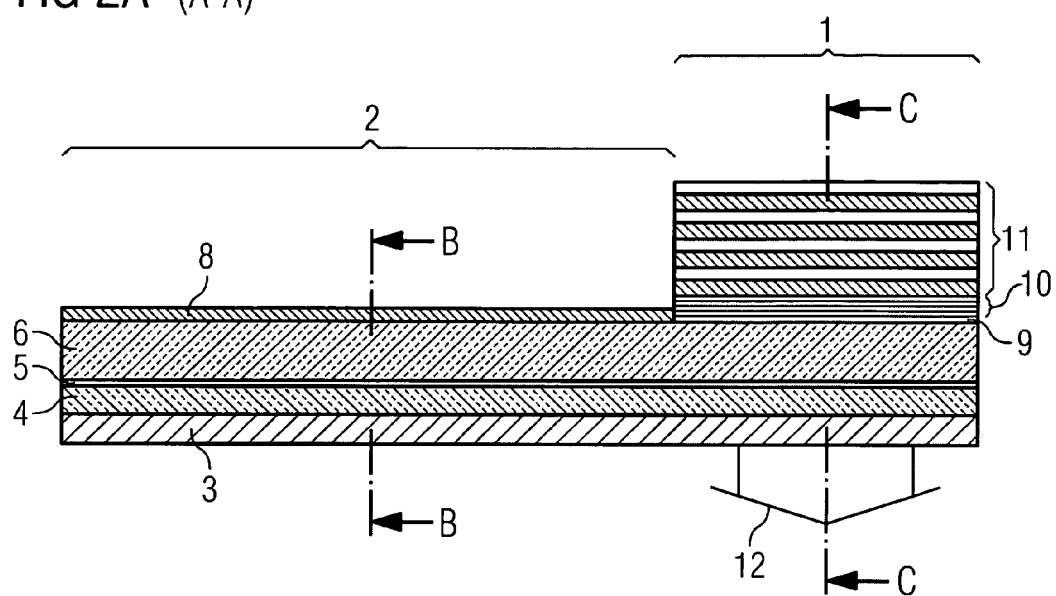
FIG 2B (B-B)
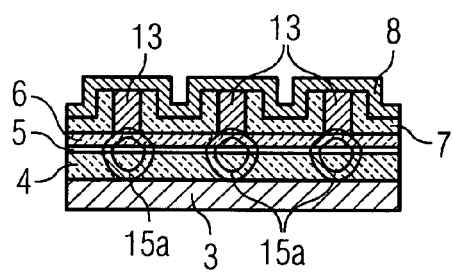
FIG 2C (C-C)
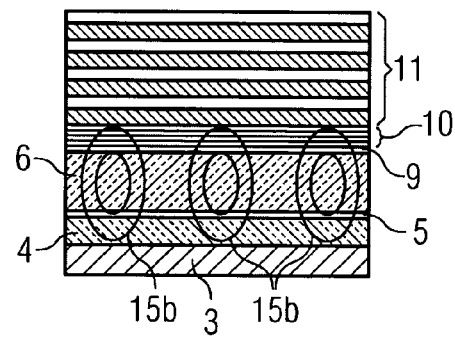

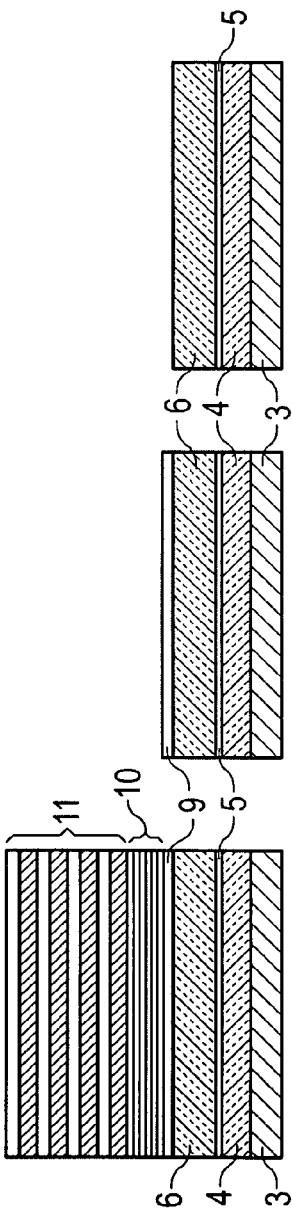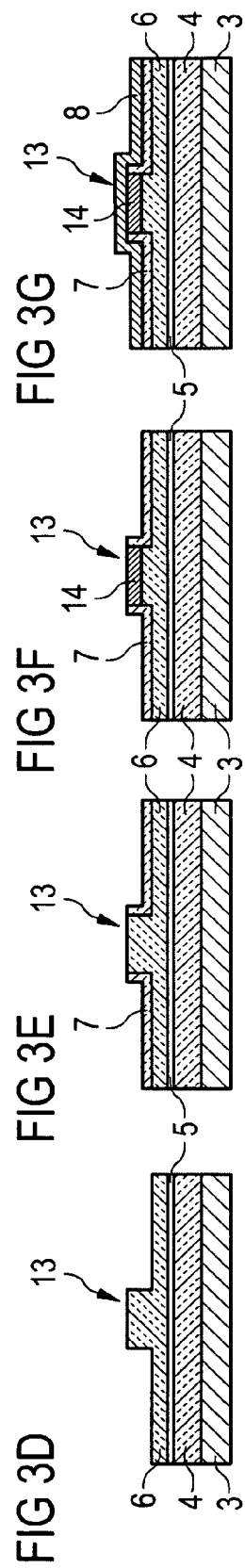

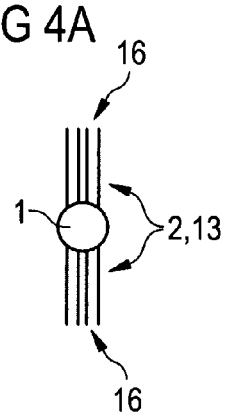
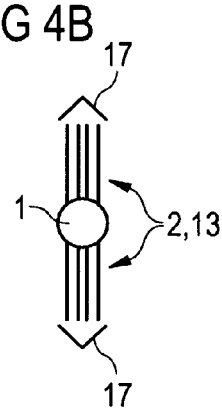
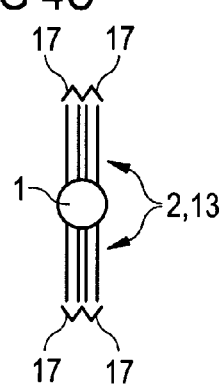
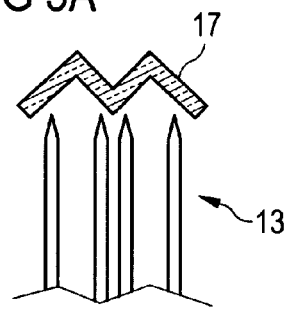
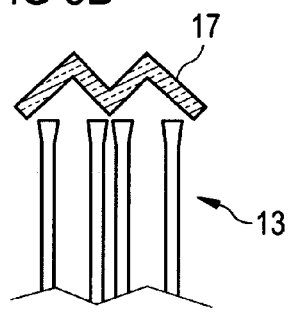
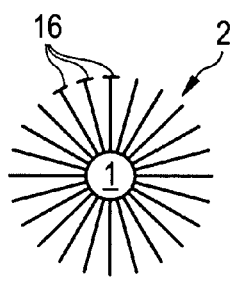
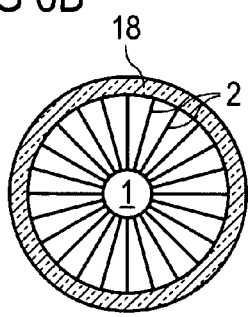
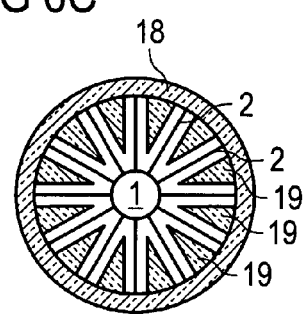

SEMICONDUCTOR LASER DEVICE

RELATED APPLICATIONS

This is a U.S. national stage under 35 USC 371 of application No. PCT/DE2007/000244 filed on 8 Feb. 2007.

This patent application claims the priority of German Patent Application nos. 10 2006 009 237.6 filed Feb. 28, 2006 and 10 2006 011 284.9 filed Mar. 10, 2006 the entire contents of both of which are hereby incorporated by reference.

BACKGROUND OF THE INVENTION

The invention relates to a semiconductor laser device comprising an optically pumped surface emitting vertical emitter and at least one monolithically integrated pump radiation source for optically pumping the vertical emitter.

Optically pumped vertically emitting semiconductor laser devices can realize high output powers in conjunction with high beam quality. A compact construction can be achieved by means of monolithically integrated pump radiation sources.

SUMMARY OF THE INVENTION

One object of the invention is to provide a semiconductor laser device of the type mentioned in the introduction having an improved efficiency.

This and other objects are attained in accordance with one aspect of the invention directed to an optically pumped surface emitting vertical emitter, which emits in a vertical main radiation direction, and at least one monolithically integrated pump radiation source for optically pumping the vertical emitter, wherein the pump radiation source emits pump radiation in a pump main radiation direction running transversely with respect to the vertical main radiation direction. In one embodiment, the semiconductor laser device is characterized by the fact that at least one vertical section of the pump radiation source is embodied in index-guiding fashion for the pump radiation in a lateral direction transversely with respect to the pump main radiation direction and transversely with respect to the vertical main radiation direction. In a second embodiment, the semiconductor laser device is characterized by the fact that the pump radiation source has a smaller width in a lateral direction transversely with respect to the pump main radiation direction in at least one vertical section than in a further vertical section.

The efficiency of the semiconductor laser device as an overall system is influenced by the efficiency of the individual components as factors. Consequently, pump radiation sources having the highest possible efficiency are essential for a high efficiency of the semiconductor laser device. In order to enable the current flow required for operation in the pump radiation sources, it is advantageous for all the current-carrying layers to be highly doped and to be contact-connected well via generally metallic contact layers. Pump radiation that is guided through or closely adjacent to a conductive layer experiences high absorption losses there, however. As a result of index guiding or reduction of the width of the pump radiation source in the lateral direction in the at least one vertical section, what is achieved given suitable dimensioning is that modes of the pump radiation are forced completely or at least partly in a vertical direction away from this section. As a result of the vertical dispelling from this section, it is advantageously possible to achieve an increase in the distance between the pump radiation mode and conductive layers, e.g. a contact layer. Absorption losses are reduced in this way.

In one embodiment of the invention, the vertical section is embodied as a waveguide in the pump main radiation direction, which waveguide has a cross section that is limited in the lateral direction and in the vertical main radiation direction. As a result, the pump radiation mode is not only dispelled in a vertical direction but also guided in a lateral direction. The pump radiation source is particularly preferably an edge emitting laser. A pump radiation source embodied in accordance with both features is also known as a narrow strip laser or ridge laser.

Preferably, the cross section of the waveguide is in this case shaped rectangularly or trapezoidally. A waveguide having this shaping can be produced in a relatively uncomplicated manner in terms of process engineering. In a further advantageous configuration, the waveguide can have a varying cross-sectional area in the pump main radiation direction. By way of example, the waveguide can end upstream of a resonator mirror of the pump radiation source in the direction of the pump radiation, or be embodied in a manner widened or tapered in the lateral direction upstream of the resonator mirror in the pump main radiation direction. In this way, a coupling of the pump radiation in and out at the resonator mirrors can be expediently influenced.

Preferably, the pump radiation source has an active radiation-generating pump radiation layer and the waveguide is embodied in a region of the pump radiation source which is spaced apart from the pump radiation layer in the vertical direction.

In a further embodiment of the invention, the semiconductor laser device is partly removed in the region of the pump radiation sources and the waveguide is formed by an uncovered semiconductor strip. In another embodiment, the waveguide is formed by semiconductor material with indiffused dopants. Both embodiments permit the entire semiconductor laser device, that is to say vertical emitter and pump radiation source or sources, firstly to be produced in one epitaxy step (so-called single-step epitaxy), and then for a structuring of the waveguides to be performed in the region of the pump radiation sources. The single-step epitaxy prevents transition losses as a result of grain boundaries or other growth effects at the transition from pump radiation sources to the vertical emitter.

Preferably, the waveguide has a width in the lateral direction which is smaller than 10 vacuum wavelengths of the pump radiation and in particular lies between 1 and 6 vacuum wavelengths of the pump radiation. The waveguide furthermore preferably has an extent between $\frac{1}{5}$ and 4 vacuum wavelengths of the pump radiation in the vertical main radiation direction. Geometrical dimensions in accordance with these features are particularly suitable for the guiding and the vertical dispelling of the pump radiation mode.

In accordance with a further embodiment of the invention, a passivation layer is provided on the pump radiation source, said passivation layer being cut out in the region of the waveguide. In accordance with a further configuration, a contact layer is provided on the pump radiation source, which contact layer makes contact with the waveguide on a side parallel to the pump radiation layer and remote from the latter. What is achieved in this way is that current is impressed into the pump radiation sources only through the waveguides. The pump radiation mode is advantageously as far away as possible from the contact layer.

Preferably, during operation a pump radiation mode is formed in the pump main radiation direction, which mode, within the pump radiation source, has an intensity maximum within the pump radiation layer with an intensity that falls from the intensity maximum radially outward in the plane spanned by the vertical main radiation direction and the lateral direction, wherein the intensity is lower within the waveguide than at a comparable distance outside the waveguide.

In a further embodiment of the invention, the vertical emitter has at least one active radiation-generating vertical emitter layer which is spaced apart from the pump radiation layer in the vertical main radiation direction. Particularly preferably, the pump radiation layer is continued into the vertical emitter and the pump radiation mode is extended within the vertical emitter in the vertical emitter direction in such a way that the pump radiation mode overlaps the vertical emitter layer during operation. By virtue of the fact that the vertical emitter layer and the pump radiation layer are successively grown layers separated vertically from one another, this results in great freedom with regard to the choice of materials and dimensioning for these layers. The wavelength of the pump radiation and of the vertically emitted radiation can thereby be set within wide limits, whereby a high pump efficiency can be achieved.

Preferably, the vertical emitter layer and/or the pump radiation layer in each case comprise(s) at least one quantum layer. In this case, in a particularly preferred embodiment, the quantum layer can have quantum wells, quantum wires, quantum dots or combinations of these structures.

In the context of the invention, therefore, a quantum layer is a layer which is dimensioned or structured in such a way that a quantization of the charge carrier energy levels that is essential for the generation of radiation occurs, for example as a result of confinement. In particular, the designation quantum layer comprises no indication or restriction with regard to the dimensionality of the quantization.

In one advantageous embodiment of the invention, an internal resonator mirror structure is disposed downstream of the pump radiation layer and the vertical emitter layer in a vertical direction, which structure is particularly preferably a Bragg reflector.

In one embodiment of the invention, the internal resonator mirror structure is arranged between the vertical emitter layer and a substrate. The radiation generated by the vertical emitter layer is coupled out on the opposite side to the substrate. As an alternative, in a another embodiment of the invention, the internal resonator mirror structure is disposed downstream of a substrate and the vertical emitter layer. The radiation generated by the vertical emitter layer is coupled out through the substrate. Particularly preferably, a coupling-out window is provided in the substrate for coupling out the radiation.

In a further embodiment of the invention, the vertical emitter layer is assigned an external mirror which, together with the internal resonator mirror structure, forms a resonator for the vertical emitter. In another embodiment of the invention, beam-shaping elements or frequency-selective elements or frequency-converting elements are arranged in the resonator.

In accordance with a further embodiment of the invention, the pump radiation source has a resonator having at least one end mirror. Preferably, two pump radiation sources arranged on mutually opposite sides of the vertical emitter have a common resonator and together form a laser structure.

In one embodiment of the invention, at least two pump radiation sources arranged parallel to one another are provided. It is particularly preferred for two pump radiation sources arranged parallel alongside one another to have a common end mirror arrangement consisting of two end mirrors arranged at right angles to one another. Furthermore it is particularly preferred for the two end mirrors to be arranged in such a way that the pump radiation experiences total reflection at them. By means of an end mirror arrangement at which total reflection occurs, it is possible to dispense with a complicated mirror-coating of the end areas of the pump radiation source.

In one embodiment of the invention, a plurality of pump radiation sources arranged around the vertical emitter in star-shaped fashion are provided. In this way, it is possible to couple pump radiation with high intensity into the vertical emitter since a multiplicity of pump radiation sources can be used. Furthermore, the pump radiation in such an arrangement is advantageously directed virtually radially symmetrically at the center of the vertical emitter, which fosters the formation of laterally symmetrical fundamental modes of the vertical emitter.

BRIEF DESCRIPTION OF THE DRAWINGS

FIGS. 2A, 2B and 2C show three different sectional views of the first exemplary embodiment of the semiconductor laser device, FIGS. 3A to 3G show a method for producing a semiconductor laser device according to the invention, illustrated on the basis of sectional views of the semiconductor laser device at different processing times, FIGS. 4A, 4B and 4C show a schematic plan view of three exemplary embodiments of a semiconductor laser device according to the invention with parallel pump radiation sources, FIGS. 5A and 5B show detailed views of two embodiments of the exemplary embodiment from FIG. 4C of different waveguide shapings in the end mirror region of the pump radiation sources, FIGS. 6A, 6B and 6C show a schematic plan view of three further exemplary embodiments of a semiconductor laser device according to the invention with a star-shaped pump radiation source arrangement.

DETAILED DESCRIPTION OF THE DRAWINGS

Figure 1:
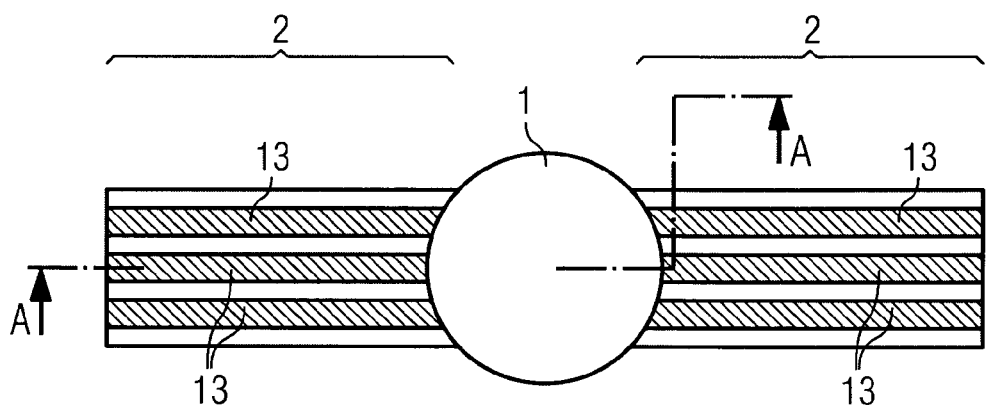
FIG. 1 shows a schematic plan view of a first exemplary embodiment of a semiconductor laser device according to the invention.

Identical or identically acting elements are provided with the same reference symbols in the figures. The figures are schematic drawings. In particular, the size of the relationships of the elements are not illustrated as true to scale.

FIG. 1 shows the plan view of a semiconductor laser device comprising a central vertical emitter 1 and also two pump radiation sources 2 arranged on opposite sides of the vertical emitter 1. In this case, the surfaces of the pump radiation sources 2 have waveguides 13 as elevated regions, said waveguides running parallel to one another and being illustrated in hatched fashion in the figure.

FIGS. 2A, 2B and 2C illustrate three cross-sectional views of the semiconductor laser device, wherein FIG. 2A represents the cross section along the cross-sectional line A-A depicted in FIG. 1.

As can be seen from FIG. 2A, the semiconductor laser device has the following layer construction. On a substrate 3 there is applied a buffer layer 4, to the latter a pump radiation layer 5 and to the latter a further buffer layer 6. In the region of the pump radiation source 2, a contact layer 8 is applied to the further buffer layer 6, said contact layer being partly separated from the further buffer layer 6 by a passivation layer 7 (not visible in this illustration). In the region of the vertical emitter 1, an etching stop layer 9 is applied to the further buffer layer 6, followed by a vertical emission layer 10, which can comprise an alternating sequence of quantum layers and barrier layers. A Bragg reflector 11 is applied to the vertical emission layer 10. In the exemplary embodiment shown, vertical radiation 12 is coupled out from the vertical emitter 1 through the substrate 3. The figure does not show an external resonator mirror which, together with the Bragg reflector 11, forms a resonator for the vertical radiation 12.

Suitable material systems for realizing the invention are found in the group of III-V compound semiconductors. The exemplary embodiment shown can be realized for example on the basis of $In_xAl_yGa_{1-x-y}As$, $In_xAl_yGa_{1-x-y}N$, $In_xAl_yGa_{1-x-y}P$ or $In_xGa_{1-x}As_yN_{1-y}$, where $0 \leq x \leq 1$, $0 \leq y \leq 1$, $0 \leq x+y \leq 1$. It goes without saying that the invention is not restricted to these material systems, but rather can also be constructed on the basis of some other material system depending on the desired wavelength or other requirement.

The pump radiation sources 2 are embodied as edge emitting, electrically pumped semiconductor lasers having a pump main radiation direction pointing parallel to the substrate 3 on the vertical emitter 1. Those end faces of the two mutually opposite pump radiation sources 2 which are remote from the vertical emitter 1 and which lie parallel to one another are embodied in reflective fashion and serve as resonator mirrors for the pump radiation. Said end faces can advantageously be produced by cleavage along a crystal direction or alternatively, by an etching process and optionally be mirror-coated in a highly reflective manner. In the exemplary embodiment shown, the two pump radiation sources 2 form a single coherently oscillating laser.

The pump radiation layer 5 can be realized by an individual optically active quantum layer for example, as illustrated in the drawing. As an alternative, the pump radiation layer 5 can be formed by a layer sequence comprising quantum layers separated by barrier layers.

As already explained further above, in the context of the application a quantum layer here should be understood to mean any layer which causes a quantization of the charge carrier energy levels by virtue of its dimensioning or structuring. The quantum layer can form a two-dimensional quantum well or contain structural elements having lower dimensionality such as quantum troughs or dashes, quantum wires or quantum dots or combinations of these structures.

For the operation of the semiconductor laser device, charge carriers are injected into the pump radiation sources 2 via the contact layer 8 and a further contact layer (not shown here) on the substrate 3, and said charge carriers recombine radiatively in the pump radiation layer 5, whereby the pump radiation is built up.

The further buffer layer 6 is adjoined by different layers in the vertical emitter 1 and in the pump radiation sources 2. The pump radiation experiences diffraction within the vertical emitter 1 owing to the resulting difference in refractive index upon transition into the vertical emitter 1 and propagates in a vertical direction, such that the pump radiation field is superposed with the vertical emission layer and the vertical emission layer 10 is thereby pumped optically as an optically active layer of the vertical emitter 1. In this case, the pump radiation can be absorbed either in the barrier layers arranged between the quantum layers and the vertical emission layer 10 (barrier layer pumping), or directly in the quantum layers (quantum layer pumping). The absorption of the pump radiation leads to the generation of electron-hole pairs which, if appropriate after diffusion into the quantum layers, consequently occupy energetically higher states of the quantum layers, with the result that a population inversion arises. The vertical radiation 12 is generated by means of this population inversion.

In the exemplary embodiment shown in FIG. 2A, the vertical radiation 12 is coupled out through the substrate 3. If the substrate 3 is not transparent to the wavelength of the vertical radiation 12, or absorption losses in the substrate are so high that they cannot be afforded tolerance, it is possible to provide a window in the substrate 3 in the region of the vertical emitter 1. As an alternative to the exemplary embodiment shown, a layer construction is also conceivable in which the Bragg reflector 11 is applied to the substrate 3 and the vertical radiation 12 is coupled out on the opposite side of the semiconductor layer device to the substrate.

FIG. 2B illustrates the cross section according to the sectional line B-B through the pump radiation source 2 of FIG. 2A. It is evident in the cross section that the width of the pump radiation source in the lateral direction transversely with respect to the pump main radiation direction is smaller in an upper, first vertical section than in the lower, further vertical section. This is achieved by a structuring of the further buffer layer 6. In the exemplary embodiment shown, three parallel waveguides 13 which form sections of reduced width are shaped in this way. In this case, the number of waveguides 13 is not in any way restricted upward or downward. The number of three waveguides 13 is chosen merely as an example. The further buffer layer 6 is covered by the passivation layer 7 with the exception of the top side of the waveguides 13. The contact layer 8 is applied to the further buffer layer 6 and the passivation layer 7, such that the contact layer 8 directly adjoins the top side of the waveguides 13 but is otherwise separated from the further barrier layer 6 by the passivation layer 7. The pump radiation generated during operation of the pump radiation sources 2 is characterized in terms of its lateral intensity distribution by the pump radiation modes 15a depicted.

The waveguides 13 firstly introduce the current required for the operation of the pump radiation sources and secondly achieve a guiding of the pump radiation in a lateral direction and also an influencing of the mode geometry in a vertical direction. For this purpose, the waveguides 13 have a limited extent in the lateral direction. In the lateral direction the waveguide 13 is so narrow in relation to the wavelength of the pump radiation that the pump radiation mode 15a cannot form or can form only to a limited degree within the waveguide 13. In FIG. 2B (section B-B), this effect can be discerned from the asymmetrical mode geometry compressed in the upper region. The intensity of pump radiation is lowered in particular in the vicinity of the contact layer 8 and the doped region of the waveguide 13, whereby absorption losses are reduced. For typical pump radiation wavelengths (vacuum wavelength), in the wavelength range of between 500 nm and 800 nm, a width of the waveguide 13 of between 500 nm and 5000 nm is particularly suitable for achieving this effect.

The height of the waveguide 13 in a vertical direction is preferably between 100 nm and 2000 nm. In the case of an excessively small height, the effect according to the invention of the vertical mode crowding is not fashioned optimally; in the case of an excessively large height, ohmic losses when impressing current reduce the efficiency of the pump radiation sources. The optimum height of the waveguide 13 should be determined as a compromise between these two effects.

The most favorable distance between the waveguide 13 and the pump radiation layer 5 is dependent on the two parameters, height and width, of the waveguide 13. In this respect, it is possible that the underside of the waveguide 13 reaches as far as the pump radiation layer 5.

In the embodiment shown, the waveguide 13 is formed by a structuring of the further buffer layer 6 in the form of a wall (ridge). In an alternative embodiment, the waveguide 13 can also be embodied without a topological structuring of the further buffer layer 6 just by means of differences in refractive index within the layer material. Regions having different refractive indices can be produced for example by laterally selective indiffusion or ion implantation of dopants or by moist-thermal oxidation.

FIG. 2C illustrates the vertical emitter 1 in cross section (section C-C of FIG. 2A). In addition to the layer construction already indicated in the upper part of the figure, the cross section C-C shows the intensity distribution of the pump radiation produced during operation as pump radiation mode 15$b$.

By comparison with the pump mode 15$a$ within the pump radiation source 2, in particular the vertical extension of the pump mode 15$b$ right into the vertical emission layers 10 is manifested. The vertical propagation of the pump radiation is based on the difference in reflective index already mentioned above owing to the different layer sequence in the vertical emitter 1 and the resultant diffraction experienced by the pump radiation upon transition into the vertical emitter 1. Furthermore, the waveguide 13 is not continued into the vertical emitter 1, such that, unlike within the pump radiation sources, the pump mode within the vertical emitter 1 is not subject to any restriction by the waveguide 13 in terms of its vertical propagation.

FIGS. 3A to 3G illustrate a production method for a semiconductor laser device on the basis of cross sections through the pump radiation source 2 (analogous to the cross section B-B in FIG. 2B) at different times in the production process. The exemplary embodiment of the semiconductor laser device shown differs from the one illustrated in FIGS. 1 and 2A-2C in that only one waveguide 13 is provided, which serves here in particular to simplify the illustration.

Advantageously, the entire semiconductor laser device, that is to say vertical emitter 1 and pump radiation sources 2, is firstly produced in a common epitaxial process. Apart from the fact that this simplifies the production process, problems in the transition region between pump radiation sources 2 and vertical emitter 1 (grain boundaries, increased defect density, offset of corresponding layers with respect to one another) that would be unavoidable in a two-step epitaxy process can be avoided. After the epitaxy, the semiconductor laser device thus has the same layer construction in the region of the pump radiation sources 2 as in the region of the vertical emitter 1. This layer construction has already been described in connection with the upper part of FIG. 2 and is reproduced again in FIG. 3A.

The semiconductor laser device is thereupon laterally selectively removed down to the further barrier layer 6 in the region of the pump radiation sources 2. This is preferably carried out in an etching process. In order to uncover the further buffer layer 6 in a defined manner with the aid of the etching process, the etching stop layer 9 is provided on the further barrier layer 6, said etching stop layer being resistant to the etching process used. After etching away down to the etching stop layer 9, (FIG. 3B), the etching stop layer 9 is for its part removed by a suitable process and the further buffer layer 6 is uncovered in this way (FIG. 3C).

In a further etching process, parallel depressions (trenches) are etched into the further buffer layer 6. This can be done for example using an etching mask. The depth of the trenches is then defined by means of the process parameters during the etch. In the exemplary embodiments shown in FIGS. 2B and 3D, the depth of the trenches does not reach as far as the pump radiation layer 5. In an alternative configuration, however, it is also conceivable to make the trenches so deep that the further buffer layer 6 and the underlying pump radiation layer 5 are completely severed by the trenches. The trenches then consequently reach right into the buffer layer 4. As an alternative, different method steps than an etch are conceivable for structuring, for example removal of the further buffer layer 6 by ion sputtering. The non-removed parallel ridge (or ridges in other exemplary embodiments) forms (form) the waveguides 13 (FIG. 3D).

In a next process step, the surface of the pump radiation sources 2 with the exception of the top side of the waveguides 13 is provided with the passivation layer 7 (FIG. 3E). This passivation layer 7 can be formed either by oxidizing the surface of the further buffer layer 6 in the corresponding regions or by applying a corresponding nonconductive layer. Since this layer need not be crystalline, it is not subject to an epitaxial growth process that is to be strictly monitored, and can be applied in a simple manner, for example by means of a CVD method (chemical vapor deposition), a sputtering process or else in a vapor deposition method.

In the next step of the method, the surface of the pump radiation sources is exposed to a dopant which indiffuses into the regions of the surface that are not covered by the passivation layer 7, that is to say into the waveguides 13, such that a doped region 14 arises (FIG. 3F). As an alternative to a diffusion process of the dopant from a gas phase, the dopant can be introduced in a targeted manner by means of ion implantation or a sputtering process. A high current conductivity of the waveguides 13 is achieved by means of the doping of the waveguides 13. In the last method step, the contact layer 8, usually a metal layer, is applied by vapor deposition (FIG. 3G).

FIGS. 4A to 4C show the plan view of three further exemplary embodiments of a semiconductor laser device according to the invention. Pump radiation sources 2 which run parallel to one another and are arranged around a vertical emitter 1 on two opposite sides are provided in all three examples. Only the waveguides 13 of the pump radiation sources 2 are depicted schematically. Four parallel waveguides 13 are provided on each of the opposite sides of the vertical emitter 1.

In the exemplary embodiment shown in FIG. 4A, those ends of the pump radiation sources which are remote from the vertical emitter 1 are embodied as resonator mirrors 16. The resonator mirrors 16 can be produced either by cleavage of the semiconductor crystal or by an etching process, preferably a plasma etching process. In each case two opposite pump radiation sources 2 are coupled by a common resonator. The pump radiation sources 2 are not arranged equidistantly in the lateral direction transversely with respect to their pump main radiation direction and transversely with respect to the vertical main radiation direction. Owing to the fact that the pump radiation sources 2 are at a smaller distance from one another in the inner region than in the outer region, the vertical emitter 1 is pumped to a greater extent in its center than in its periphery. A laterally fundamental-mode emission of the vertical emitter 1 is advantageously excited in this way.

The exemplary embodiment shown in FIG. 4B differs from the one shown in FIG. 4A by virtue of the embodiment of the resonator mirrors 16. In this case, a common resonator mirror arrangement 17, consisting of two mirror areas arranged perpendicular to one another, is provided for the four pump radiation sources 2 arranged on one side of the vertical emitter 1. Such a mirror arrangement is also known as a retroreflector. Two ring laser structures arise, formed by the respective inner pump radiation sources 2 and the respective outer pump radiation sources 2. The embodiment of the resonator mirrors as retroreflectors affords the advantage that total reflection occurs at the two mirror areas, whereby a complicated mirror coating with a highly reflective material or a dielectric layer stack can be dispensed with.

In the exemplary embodiment shown in FIG. 4C, in each case two of such resonator mirror arrangements 17 are provided, whereby respective adjacent pump radiation sources 2 are coupled to form a ring laser.

FIGS. 5A and 5B illustrate two embodiments of a semiconductor laser device in accordance with FIG. 4C. If the waveguides 13 are led in a constant cross section up to the resonator mirrors, the pump radiation leaves the region of the waveguiding by the waveguide 13 with a laterally narrow mode distribution. In that case a very exact mirror alignment is necessary in order that the pump radiation emerging from a pump radiation source 2 is effectively coupled into a further pump radiation source 2 that shares a common resonator. By altering the cross section of the waveguides 13 in a region upstream of the end mirror arrangement, which can be done either by tapering (FIG. 5A) or widening (FIG. 5B), the lateral mode distribution of the pump radiation is widened and the coupling-in efficiency is thus improved. This effect can be supported by means of the waveguides 13 already ending upstream of the common resonator mirror arrangement 17.

FIGS. 6A to 6C illustrate three further embodiments of a semiconductor laser device according to the invention in plan view. In these exemplary embodiments, a central vertical emitter 1 is optically pumped by pump radiation sources 2 arranged in a star-shaped manner. Pump radiation with high intensity can be introduced into the vertical emitter 1 in this way. Furthermore, owing to its approximately radially symmetrical intensity distribution of the pump radiation, this arrangement fosters the formation of a laterally fundamental-mode emission of the vertical emitter 1.

In the exemplary embodiment shown in FIG. 6A, in each case two opposite pump radiation sources 2 form a common laser structure, wherein those end faces of the pump radiation sources 2 which are remote from the vertical emitter 1 are embodied as resonator mirrors 16. In this case, the resonator mirrors 16 are produced by an etching process since suitable crystal facets with the necessary orientation diversity are not usually available.

As an alternative to the individually shaped resonator mirrors 16 of each individual pump radiation source 2, a common, circular resonator mirror 18 can be provided, as illustrated in the exemplary embodiment in FIG. 6B. This embodiment is simpler to realize in terms of process technology, but undesired ring resonances can occur.

In the exemplary embodiment shown in FIG. 6C, absorber structures 19 for preventing such ring resonances are provided in the intermediate region between the pump radiation sources 2. These absorber structures can be formed for example by V-shaped trenches which are etched into the semiconductor laser device and the surface of which is provided with an absorbent material, for example a metal. In this case, the absorbent layer is advantageously electrically isolated from the semiconductor laser device by a thin insulation layer.

The explanation of the invention on the basis of the exemplary embodiments described should not be understood as a restriction of the invention thereto. Rather, the invention also encompasses the combination with all other features mentioned in the exemplary embodiments and the rest of the description, even if this combination is not the subject of a patent claim.

The invention claimed is:

1. A semiconductor laser device comprising:
an optically pumped surface emitting vertical emitter having at least one active radiation-generating vertical emitter layer which is spaced apart from a pump radiation layer in a vertical main radiation direction, the optically pumped surface emitting vertical emitter emitting in the vertical main radiation direction; and
at least monolithically integrated pump radiation source, comprising the pump radiation layer, for optically pumping the vertical emitter, the pump radiation source emitting pump radiation in a pump main radiation direction extending transversely with respect to the vertical main radiation direction;
wherein at least one vertical section of the pump radiation source is configured in an index-guiding manner for the pump radiation in a lateral direction transversely with respect to the pump main radiation direction and transversely with respect to the vertical main radiation direction;
wherein the vertical section of the pump radiation source comprises a waveguide extending in the pump main radiation direction, said waveguide having a cross section which is limited in the lateral direction and in the vertical main radiation direction, and wherein a width of the waveguide in the lateral direction is smaller than 10 vacuum wavelengths of the pump radiation;
wherein the semiconductor laser device is partly removed in a region of the at least one monolithically integrated pump radiation source and the waveguide is formed by an uncovered semiconductor strip.

2. The semiconductor laser device as claimed in claim 1, wherein the at least one monolithically integrated pump radiation source has an active radiation-generating pump radiation layer and the waveguide is provided in a region of the at least one monolithically integrated pump radiation source which is spaced apart from the pump radiation layer in the vertical main radiation direction.

3. The semiconductor laser device as claimed in claim 1, wherein the waveguide is formed by semiconductor material with indiffused dopants.

4. The semiconductor laser device as claimed in claim 1, wherein the waveguide has a width in the lateral direction which lies between 1 and 6 vacuum wavelengths of the pump radiation.

5. The semiconductor laser device as claimed in claim 1, wherein the waveguide has an extent of between $\frac{1}{5}$ and 4 vacuum wavelengths of the pump radiation in the vertical main radiation direction.

6. The semiconductor laser device as claimed in claim 1, wherein a contact layer is provided on the at least one monolithically integrated pump radiation source, said contact layer contacting the waveguide on a side parallel to the pump radiation layer and remote from the pump radiation layer.

7. The semiconductor laser device as claimed in claim 1, wherein the at least one monolithically integrated pump radiation source is an edge emitting laser and comprises a resonator having at least one resonator mirror.

8. The semiconductor laser device as claimed in claim 1, wherein two monolithically integrated pump radiation sources arranged on mutually opposite sides of the vertical emitter have a common resonator having at least one resonator mirror and together form a laser.

9. The semiconductor laser device as claimed in claim 1, wherein a plurality of monolithically integrated pump radiation sources are arranged parallel alongside one another and have a common resonator mirror arrangement consisting of two resonator minors arranged at right angles to one another.

10. The semiconductor laser device as claimed in claim 7, wherein the waveguide ends upstream of the at least one resonator mirror in the direction of the pump radiation.

11. The semiconductor laser device as claimed in claim 10, wherein the waveguide is configured to one of taper and widen in the lateral direction upstream of the at least one resonator mirror in the direction of the pump radiation.

12. A semiconductor laser device comprising:
an optically pumped surface emitting vertical emitter, which emits in a vertical main radiation direction; and
at least one monolithically integrated pump radiation source for optically pumping the vertical emitter, the pump radiation source emitting pump radiation in a pump main radiation direction extending transversely with respect to the vertical main radiation direction;
wherein the at least one monolithically integrated pump radiation source comprises a pump radiation layer and has a smaller width in a lateral direction transversely with respect to the pump main radiation direction in at least one vertical section than in a further vertical section comprising a waveguide in the pump main radiation direction, the waveguide having a cross section that is limited in the lateral direction and in the vertical main radiation direction; and
wherein the vertical emitter has at least one active radiation-generating vertical emitter layer which is spaced apart from the pump radiation layer in the vertical main radiation direction; and
wherein the waveguide has an extent of between ⅕ and 4 vacuum wavelengths of the pump radiation in the vertical main radiation direction.

13. The semiconductor laser device as claimed in claim 12, wherein the pump radiation source has an active radiation-generating pump radiation layer and the waveguide is provided in a region of the at least one monolithically integrated pump radiation source which is spaced apart from a pump radiation layer in the vertical main radiation direction.

14. The semiconductor laser device as claimed in claim 12, wherein the semiconductor laser device is partly removed in a region of the at least one monolithically integrated pump radiation sources and the waveguide is formed by an uncovered semiconductor strip.

15. The semiconductor laser device as claimed in claim 12, wherein the waveguide is formed by semiconductor material with indiffused dopants.

16. The semiconductor laser device as claimed in claim 12, wherein the waveguide has a width in the lateral direction which is smaller than 10 vacuum wavelengths of the pump radiation.

17. The semiconductor laser device as claimed in claim 16, wherein the waveguide has a width in the lateral direction which lies between 1 and 6 vacuum wavelengths of the pump radiation.

18. The semiconductor laser device as claimed in claim 12, wherein a contact layer is provided on the at least one monolithically integrated pump radiation source, said contact layer contacting the waveguide on a side parallel to a pump radiation layer and remote from the pump radiation layer.

19. The semiconductor laser device as claimed in claim 12, wherein the at least one monolithically integrated pump radiation source is an edge emitting laser and comprises a resonator having at least one resonator mirror.

20. The semiconductor laser device as claimed in claim 19, wherein the waveguide ends upstream of the at least one resonator mirror in a direction of the pump radiation.

21. The semiconductor laser device as claimed in claim 20, wherein the waveguide is configured to one of taper and widen in the lateral direction upstream of the at least one resonator mirror in the direction of the pump radiation.

22. The semiconductor laser device as claimed in claim 12, wherein two monolithically integrated pump radiation sources arranged on mutually opposite sides of the vertical emitter have a common resonator having at least one resonator minor and together form a laser.

23. The semiconductor laser device as claimed in claim 12, wherein a plurality of monolithically integrated pump radiation sources are arranged parallel alongside one another and have a common resonator mirror arrangement consisting of two resonator minors arranged at right angles to one another.

24. A semiconductor laser device comprising:
an optically pumped surface emitting vertical emitter, which emits in a vertical main radiation direction, and
a plurality of monolithically integrated pump radiation sources for optically pumping the vertical emitter, each of said plural pump radiation sources emitting pump radiation in a pump main radiation direction extending transversely with respect to the vertical main radiation direction,
wherein at least one vertical section of each of said plural pump radiation sources is configured in an index-guiding manner for the pump radiation in a lateral direction transversely with respect to the pump main radiation direction and transversely with respect to the vertical main radiation direction, and
wherein said plural monolithically integrated pump radiation sources are arranged parallel alongside one another and have a common resonator mirror arrangement consisting of two resonator mirrors arranged at right angles to one another.

25. A semiconductor laser device comprising:
an optically pumped surface emitting vertical emitter, which emits in a vertical main radiation direction; and
at least one monolithically integrated pump radiation source for optically pumping the vertical emitter, the pump radiation source emitting pump radiation in a pump main radiation direction extending transversely with respect to the vertical main radiation direction;
wherein the at least one monolithically integrated pump radiation source has a smaller width in a lateral direction transversely with respect to the pump main radiation direction in at least one vertical section than in a further vertical section; and
wherein a plurality of monolithically integrated pump radiation sources are arranged parallel alongside one another and have a common resonator minor arrangement consisting of two resonator mirrors arranged at right angles to one another.

26. A semiconductor laser device comprising:
an optically pumped surface emitting vertical which emits in a vertical main radiation direction; and
at least one monolithically integrated pump radiation source, comprising a pump radiation layer, for optically pumping the vertical emitter, the pump radiation source emitting pump radiation in a pump main radiation direction extending transversely with respect to the vertical main radiation direction;
wherein at least one vertical section of the pump radiation source is configured in an index-guiding manner for the pump radiation in a lateral direction transversely with respect to the pump main radiation direction and transversely with respect to the vertical main radiation direction;

wherein the vertical section of the pump radiation source comprises a waveguide extending in the pump main radiation direction, said waveguide having a cross section which is limited in the lateral direction and in the vertical main radiation direction, wherein a width of the waveguide in the lateral direction is smaller than 10 vacuum wavelengths of the pump radiation, and wherein the waveguide has an extent of between 1/5 and 4 vacuum wavelengths of the pump radiation in the vertical main radiation direction; and wherein the vertical emitter has at least one active radiation-generating vertical emitter layer which is spaced apart from the pump radiation layer in the vertical main radiation direction.

* * * * *